(12) United States Patent
Fukuda

(10) Patent No.: US 7,176,527 B2
(45) Date of Patent: Feb. 13, 2007

(54) SEMICONDUCTOR DEVICE AND METHOD OF FABRICATING SAME

(75) Inventor: Koichi Fukuda, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 66 days.

(21) Appl. No.: 10/682,477

(22) Filed: Oct. 10, 2003

(65) Prior Publication Data

US 2004/0201063 A1 Oct. 14, 2004

(30) Foreign Application Priority Data

Apr. 10, 2003 (JP) ............................. 2003-106793

(51) Int. Cl.
  *H01L 27/01* (2006.01)
  *H01L 27/12* (2006.01)
  *H01L 31/0392* (2006.01)
  *H01L 29/76* (2006.01)
  *H01L 29/94* (2006.01)

(52) U.S. Cl. .................... 257/347; 257/336; 257/344; 257/348; 257/349; 257/350; 257/351; 257/352; 257/353; 257/354; 257/372; 257/373; 257/389; 257/394; 257/408

(58) Field of Classification Search ........ 257/347–354, 257/336, 344, 372–373, 386, 394, 408
See application file for complete search history.

(56) References Cited

U.S. PATENT DOCUMENTS

| | | | | |
|---|---|---|---|---|
| 5,650,354 A | * | 7/1997 | Himi et al. | 438/152 |
| 5,985,708 A | * | 11/1999 | Nakagawa et al. | 438/206 |
| 6,159,778 A | * | 12/2000 | Kim | 438/151 |
| 6,303,450 B1 | * | 10/2001 | Park et al. | 438/300 |
| 6,429,084 B1 | * | 8/2002 | Park et al. | 438/305 |
| 6,429,482 B1 | * | 8/2002 | Culp et al. | 257/345 |
| 6,440,788 B2 | * | 8/2002 | Mandelman et al. | 438/204 |
| 6,452,232 B1 | * | 9/2002 | Adan | 257/347 |
| 6,541,821 B1 | * | 4/2003 | Krishnan et al. | 257/347 |
| 6,633,066 B1 | * | 10/2003 | Bae et al. | 257/347 |
| 6,730,964 B2 | * | 5/2004 | Horiuchi | 257/347 |
| 6,734,500 B2 | * | 5/2004 | Ebina | 257/347 |
| 7,041,538 B2 | * | 5/2006 | Ieong et al. | 438/151 |
| 2002/0050614 A1 | * | 5/2002 | Unnikrishnan | 257/347 |

(Continued)

FOREIGN PATENT DOCUMENTS

JP  2-144969  6/1990

(Continued)

*Primary Examiner*—Ida M. Soward
(74) *Attorney, Agent, or Firm*—Volentine & Whitt, PLLC

(57) ABSTRACT

A semiconductor device and a method of fabricating the same suppress a substrate floating effect without causing lowering of a degree of integration. The semiconductor device has a Silicon-On-Insulator structure which includes a semiconductor layer formed on an insulator, and has at least one MOSFET element. The MOSFET element includes a source region; a drain region which is opposed to the source region; a body region disposed between the source and drain regions; a gate region positioned on or close to a surface of the body region, so as to form an electrically conducting channel in the body region; and an extracting region being in contact with both of the body region and the source region. The extracting region has a conductivity type which is the same as a conductivity type of the body region and has a concentration higher than that of the body region.

11 Claims, 16 Drawing Sheets

U.S. PATENT DOCUMENTS

| | | | |
|---|---|---|---|
| 2002/0149058 A1* | 10/2002 | Culp et al. | 257/354 |
| 2002/0163036 A1* | 11/2002 | Miura et al. | 257/336 |
| 2002/0197810 A1* | 12/2002 | Hanafi et al. | 438/330 |
| 2003/0117151 A1* | 6/2003 | Kunikiyo et al. | 324/658 |
| 2003/0122164 A1* | 7/2003 | Komatsu | 257/219 |
| 2004/0043568 A1* | 3/2004 | Kar et al. | 438/279 |
| 2004/0075141 A1* | 4/2004 | Maeda et al. | 257/347 |
| 2004/0129979 A1* | 7/2004 | Park et al. | 257/350 |
| 2004/0198002 A1* | 10/2004 | Murakami et al. | 438/279 |
| 2005/0048732 A1* | 3/2005 | Park et al. | 438/305 |
| 2005/0051851 A1* | 3/2005 | Chen et al. | 257/369 |

FOREIGN PATENT DOCUMENTS

| | | |
|---|---|---|
| JP | 3-94471 | 4/1991 |
| JP | 4-116984 | 4/1992 |
| JP | 7-193248 | 7/1995 |
| JP | 11-74538 | 3/1999 |
| JP | 2001-53280 | 2/2001 |

* cited by examiner

SEMICONDUCTOR DEVICE AND METHOD OF FABRICATING SAME

BACKGROUND OF THE INVENTION

1. Field of the Invention

The present invention relates to a semiconductor device including a MOSFET (Metal-Oxide-Semiconductor-Field-Effect-Transistor) that uses an SOI (Silicon-On-Insulator) substrate and a method of fabricating the same.

2. Description of the Related Art

A MOSFET that uses an SOI substrate offers advantages over an ordinary bulk MOSFET. The reduction of parasitic capacitance improves circuit performance because no p-n junction exists on the bottom regions of source and drain regions. In addition, undesirable performance such as latch-up and so on, which is caused by a parasitic element, can be eliminated because an element is completely separated from adjacent elements on the SOI substrate.

There are two types of SOI, that is, a fully depleted type (hereinafter referred to as FD (Fully Depleted) type) and a partially depleted type (hereinafter referred to as PD (Partially Depleted) type). The FD type offers advantages in that since there is no depletion layer capacitance, when a voltage is applied to a gate, a precipitous channel formation can be realized, that is, precipitous sub-threshold characteristics can be realized; and a short channel effect can be largely suppressed due to the thickness of the silicon layer on a buried oxide layer (hereinafter referred to as BOX layer).

In a semiconductor device using an SOI substrate, a silicon layer is completely insulated from a substrate by the BOX layer. This causes a substrate floating effect. By the substrate floating effect, holes are generated and remain in a body region of the silicon layer when carriers (electrons in the case of NMOS) induce collision ionization in the neighborhood of a drain region. Such remaining holes increase a body voltage and cause an increase of a drain current. As a result, a breakdown voltage between source and drain regions is lowered. Additionally, such a variation of the body voltage causes undesirable performance when the current largely varies with respect to a voltage, in particular in the case of an analog circuit.

In a semiconductor device using an SOI substrate, in order to suppress the substrate floating effect, a method of fixing a body voltage is used. The method of fixing the body voltage is disclosed in, for example, Kokai (Japanese unexamined patent publication) No. 3-94471. In the method, a high concentration extracting region (a p$^+$ layer in the case of NMOS) is in contact with a source region and an end portion of a body region in which an electrically conducting channel is formed, and the high concentration extracting region is formed along the surface of the silicon layer (SOI layer). The remaining holes are thereby extracted and the increase of the body voltage is inhibited from occurring.

According to the method described above, However, since the extracting region is necessary to be formed adjacent to the source region, a decrease in the degree of integration results. Such a decrease in the degree of integration is very disadvantageous in an LSI that is integrated with a gate width of approximately 0.2 μm. In this point, as described in Kokai No. 3-94471, it is disclosed that since the layer of the extracting region is disposed below the layer of the source and drain regions in the semiconductor device, the decrease in the degree of integration can be avoided. Technically it is possible to fabricate a PD type of SOI MOSFET having such a structure when the silicon layer which constitutes the SOI MOSFET is thick. However, there is a problem in that it is difficult to fabricate a FD type of SOI MOSFET having such a structure when the silicon layer is thick.

SUMMARY OF THE INVENTION

The present invention intends to provide a semiconductor device which can suppress a substrate floating effect without causing a decrease in the degree of integration and a method of fabricating the same.

According to one aspect of the invention, the invention is a semiconductor device. The semiconductor device has a Silicon-On-Insulator structure which includes a semiconductor layer formed on an insulator, and has at least one Metal-Oxide-Semiconductor-Field-Effect-Transistor (MOSFET) element. The MOSFET element comprises a source region; a drain region which is opposed to the source region; a body region disposed between the source region and the drain region; a gate region positioned on or close to a surface of the body region, so as to form an electrically conducting channel in the body region; and an extracting region being in contact with both of the body region and the source region. The extracting region has a conductivity type which is the same as a conductivity type of the body region and has a concentration higher than that of the body region.

According to other aspect of the invention, the invention is a method of fabricating a semiconductor device. The semiconductor device has a Silicon-On-Insulator structure which includes a semiconductor layer formed on an insulator, and has at least one MOSFET element. The MOSFET element comprises a source region; a drain region which is opposed to the source region; a body region disposed between the source region and the drain region; and a gate region positioned on or close to a surface of the body region, so as to form an electrically conducting channel in the body region. The method comprises the step of introducing impurities using a mask covering an area above the drain region to form an extracting region being in contact with both of the body region and the source region. The extracting region has a conductivity type which is the same as a conductivity type of the body region and has a concentration higher than that of the body region.

According to further other aspect of the invention, the invention is a method of fabricating a semiconductor device. The semiconductor device has a Silicon-On-Insulator structure which includes a semiconductor layer formed on an insulator, and has at least one MOSFET element. The MOSFET element comprises a source region; a drain region which is opposed to the source region; a body region disposed between the source region and the drain region; and a gate region positioned on or close to a surface of the body region, so as to form an electrically conducting channel in the body region. The method comprises the step of introducing impurities by an oblique ion implantation using the gate region as a mask to form an extracting region being in contact with both of the body region and the source region. The extracting region has a conductivity type which is the same as a conductivity type of the body region and has a concentration higher than that of the body region.

According to the present invention, it is possible to provide the extracting region which extracts the remaining carriers caused by the substrate floating effect, without lowering the degree of integration. In addition, The extracting region can be provided not only in the PD type SOI but also in the FD type SOI.

The foregoing and other objects, features, aspects and advantages of the present invention will become more

DETAILED DESCRIPTION OF THE INVENTION

Embodiments of the invention will be explained in detail with reference to the attached drawings.

<First Embodiment>

Figure 1:
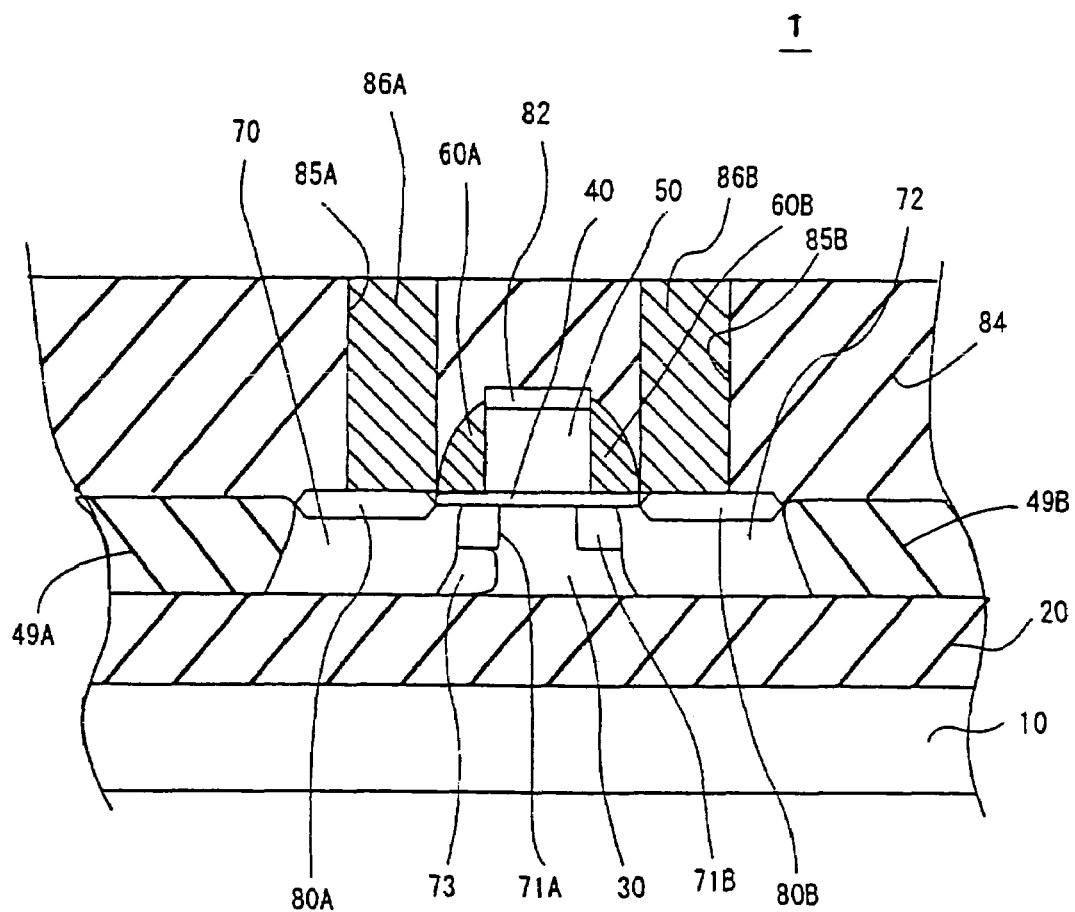
FIG. 1 is schematic sectional view of a semiconductor device in a first embodiment.

FIG. 1 shows a sectional view in a first embodiment of a semiconductor device according to the present invention. In the drawing, a structure of one MOSFET, which is included in a semiconductor device 1, is shown. The semiconductor device 1 is not restricted to being constituted of one MOSFET, and may be constituted of a plurality of MOSFETs.

A MOSFET of the semiconductor device 1 includes a Si substrate 10; a BOX layer 20 disposed on the Si substrate 10; a SOI layer 30 or a body region disposed on the BOX layer 20; a source region 70 formed by ion-implanting in the SOI layer 30; a drain region 72 formed by ion-implanting in the SOI layer 30; and a gate region having a polysilicon film 50 disposed on a gate oxide layer 40 which is formed on the SOI layer 30. The MOSFET constitution may be either a PMOS type or an NMOS type. A thickness of the SOI layer 30 may be, for instance, 0.05 μm.

A silicide film 80A and a contact metal 86A are disposed above the source region 70 in this order, and a current-conducting path is thereby formed between the source region 70 and the outside. A silicide film 80B and A contact metal 86B are disposed above the drain region 72 in this order, and a current-conducting path is thereby formed between the drain region 72 and the outside. A silicide film 82 and a contact metal (not shown in the drawing) are disposed above the polysilicon region 50 in this order, and a voltage is thereby enabled to apply to the polysilicon region 50 from the outside, and a gate electrode is formed. Sidewall spacers 60A and 60B are disposed on both sides of the polysilicon region 50 on the gate oxide layer 40.

Extension regions 71A and 71B are disposed in the downward neighborhood of the side wall spacers 60A and 60B, and are spaced from the side wall spacers 60A and 60B by the gate oxide layer 40. The extension regions 71A and 71B includes LDD (Lightly Doped Drain) regions that suppress a short channel effect.

On both sides of the MOSFET, element isolation films 49A and 49B are respectively disposed adjacent to the source region 70 and the drain region 72, and laterally isolate the MOSFET element from other MOSFET elements (not shown in the drawing) in the semiconductor device 1. The SOI layer 30 is disposed between the source and drain regions 70 and 72. Furthermore, on the above-mentioned respective layers, NSG (Non-Doped Silicate Glass) 84 is disposed as a protective layer.

An extracting region 73 is disposed so as to be in contact with only both of the source region 70 and the body region 30, and extends to the SOI layer 30. The extracting region 73 does not directly join with the silicide film 80A. Furthermore, the extracting region 73 is formed thinner than that of the SOI layer 30 and is preferably formed so as to extend from a lower portion of the source region 70 in the neighborhood of the BOX layer 20. Therefore, the extracting region 73 do not disturb the LDD region or the formation of the electrically conducting channel in the SOI layer 30. A thickness of the extracting region 73 is set at a 0.025 μm relative to the SOI layer 30 having a thickness of, for instance, 0.05 μm. The extracting region 73 is formed with a conductivity type (p type or n type) the same as that of the body region and with a impurity concentration higher than that of the body region. For instance, in the case of an NMOS, the extracting region 73 is formed into a p+ region that is doped with an impurity concentration higher than that of the body region that is a p− region.

Behavior of the carriers in the above configuration will be explained assuming that the present semiconductor device 1 is an NMOS type semiconductor. In this case, electrons drift from the source region 70 of an n+ region to the channel formation region of the SOI layer 30 of a p− region and go through to the drain region 72 of an n+ region. At this time, a part of electrons collides with a potential barrier of the drain region 72 and induces ionization, and holes are thereby generated.

It is conceivable that such holes is surrounded by the potential barriers at the junction between the p− region of the SOI layer 30 and the n+ region of the source region 70 and at the junction between the p− region and the drain region 72, and that the holes are not exhausted and becomes remaining holes in the ordinary configuration. On the other hand, in the present configuration, the holes easily penetrate through from the SOI layer 30 of a p− region to the extracting region 73 of a p+ region. The holes that have penetrated through to the extracting region 73 further go through to the source region 70 of an n+ region and go out due to diffusion or recombination with electrons. This is realized when the holes move to the source region 70 by a tunnel effect at the junction between the extracting region 73 of a p+ region and the source region 70 of an n+ region. Such tunnel effect is generated owing to a narrow depletion layer formed by a precipitous potential variation formed by the junction between a p+ region and an n+ region. The above-mentioned behavior of the remaining carriers is the same also in remaining electrons in the case of a PMOS.

Each of FIGS. 2 through 20 shows a sectional view of a semiconductor device in each of steps of a fabricating method of a semiconductor device in a first embodiment.

Figure 2:
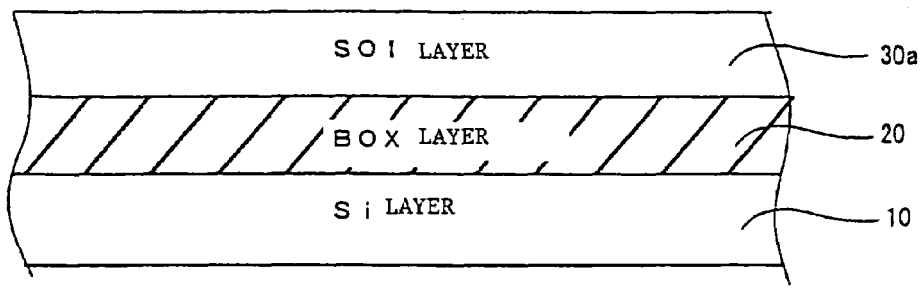
FIG. 2 is a schematic sectional view in a step of preparing an SOI substrate.
Figure 3:
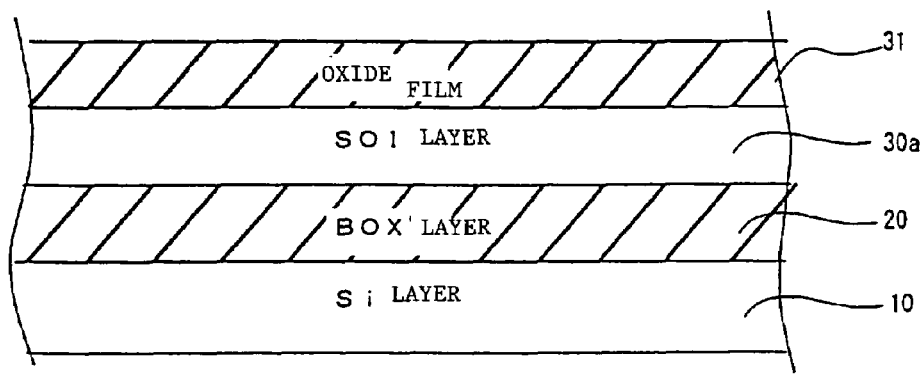
FIG. 3 is a schematic sectional view in a step of forming a sacrificial oxide film.
Figure 4:
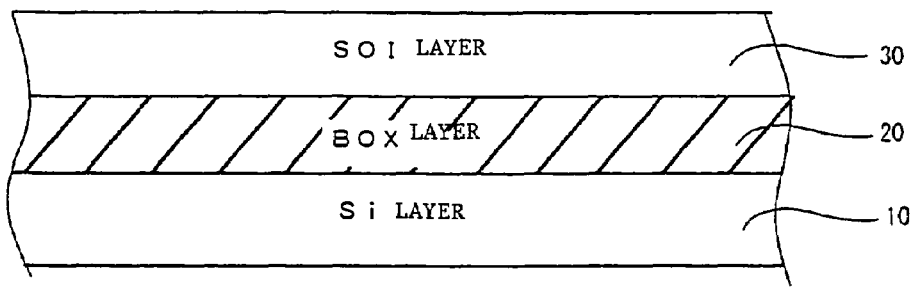
FIG. 4 is a schematic sectional view in a step of controlling a thickness of an SOI layer.

First, with reference to FIGS. 2 through 4, a fabricating method of an SOI substrate will be explained. As shown in FIG. 2, a substrate made of a silicon substrate 10, a buried oxide layer (BOX layer) 20, and a SOI layer (silicon layer) 30a is prepared. Next, a surface of the SOI layer 30a of the substrate is oxidized, and sacrificial oxide film 31 shown in FIG. 3 is thereby formed on the SOI layer 30a. The sacrificial oxide film 31 is removed by etching. As a result, on the buried oxide film 20, an SOI substrate that has an SOI layer 30 whose thickness is controlled to approximately 0.05 μm is formed (FIG. 4).

Figure 5:
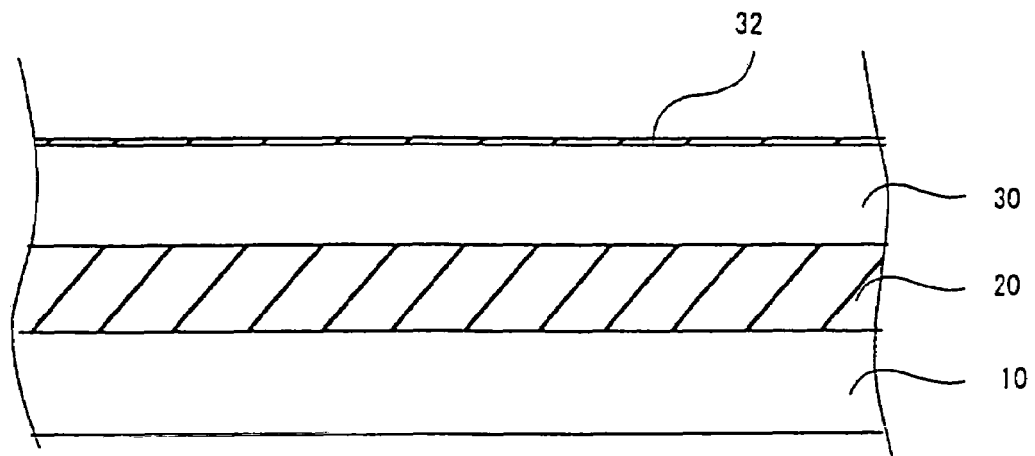
FIG. 5 is a schematic sectional view in a step of forming a pad oxide film.
Figure 6:
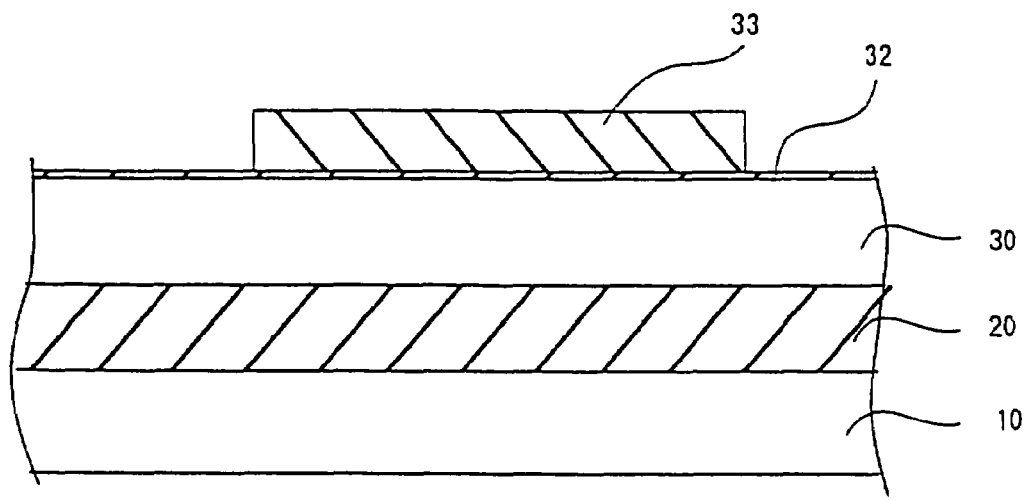
FIG. 6 is a schematic sectional view in a step of forming a nitride film.
Figure 7:
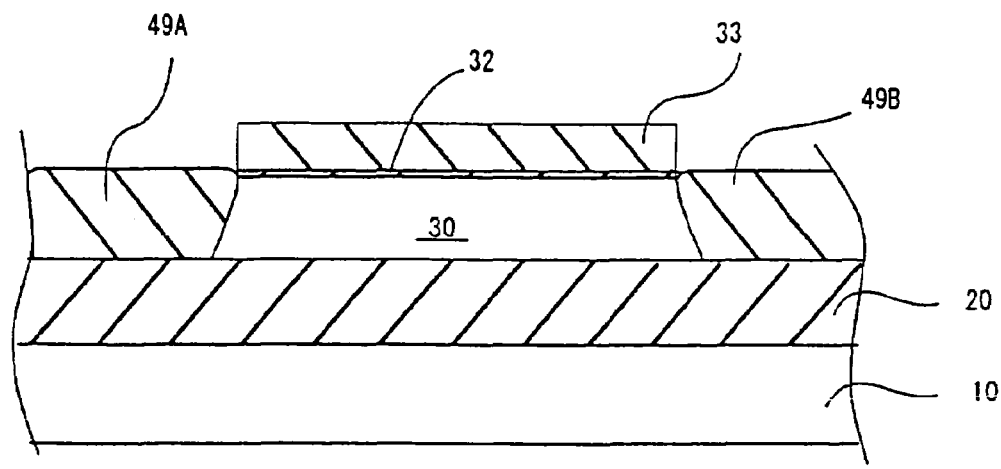
FIG. 7 is a schematic sectional view in a step of forming an element isolation film.
Figure 8:
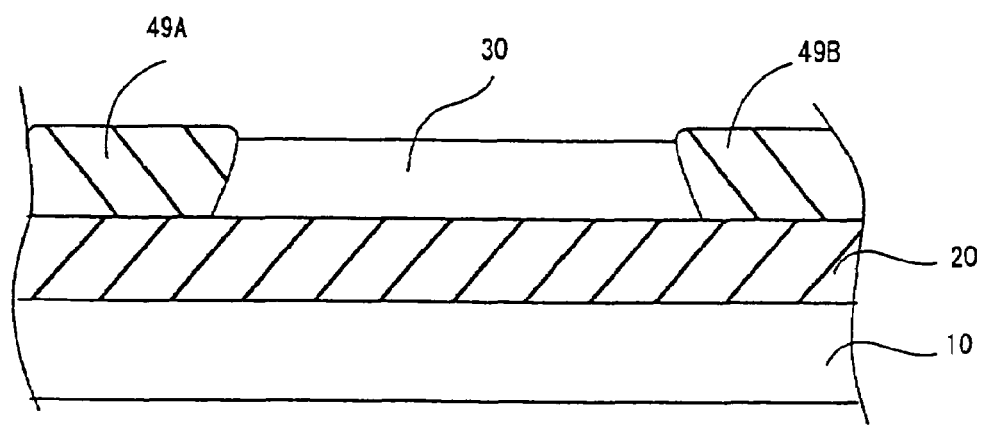
FIG. 8 is a schematic sectional view in a step of exposing the SOI layer.

In the next step, a surface of the SOI layer 30 is oxidized and pad oxide film 32 is thereby formed (FIG. 5). Furthermore, on an entire surface of the pad oxide film 32, a silicon nitride film is deposited. In a photolithography process, A resist film (organic photosensitive resin) is coated on the silicon nitride film, and is exposed to light and then is developed. As a result, a nitride film 33 shown in FIG. 6 is formed in a device formation region. Still furthermore, when heat treatment is applied in an atmosphere of oxygen, the surface of the SOI layer 30 is oxidized in a region that is not covered by the nitride film 33, and thereby element isolation films 49A and 49B called field oxide films are formed (FIG. 7). Thereafter, the nitride film 33 and the pad oxide film 32 are removed by etching, and thereby, as shown in FIG. 8, a top surface of the SOI layer 30 is exposed. The above-mentioned method of forming the element isolation films 49A and 49B is called LOCOS (Local Oxidation of Silicon). In the present process, the LOCOS is used. A trench isolation technique such as STI (Shallow Trench Isolation) and the like may be used instead of the LOCOS.

Figure 9:
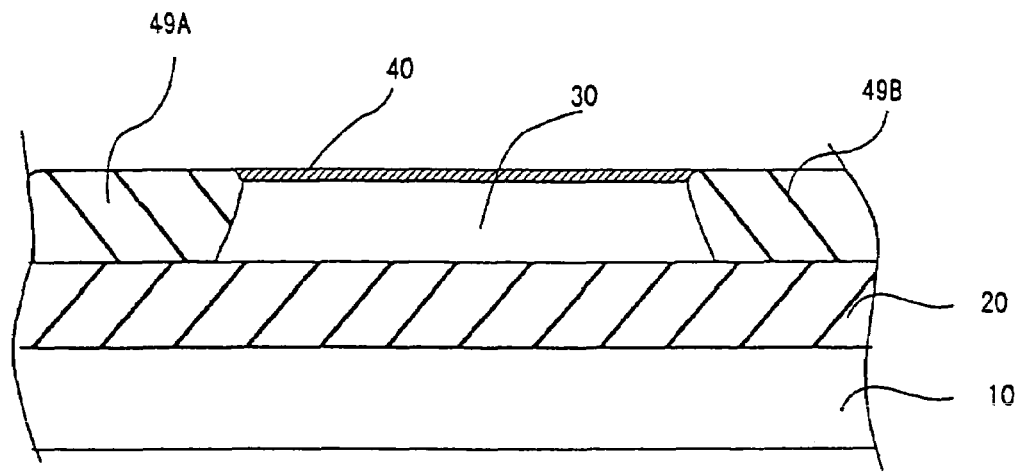
FIG. 9 is a schematic sectional view in a step of forming a gate oxide layer.
Figure 10:
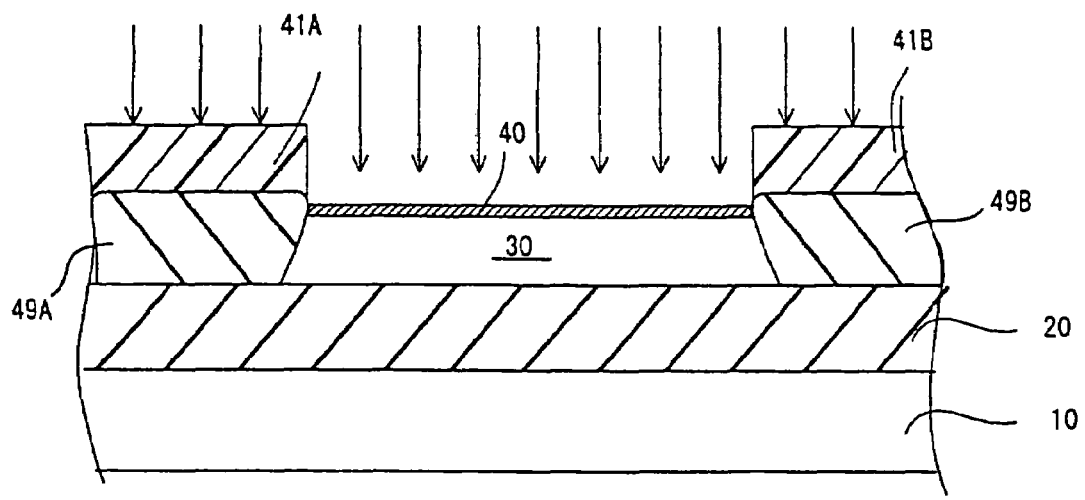
FIG. 10 is a schematic sectional view in a step of implanting low concentration ions into the SOI layer.

In the next stage, as shown in FIG. 9, a gate oxide layer 40 is formed on the SOI layer 30 in a thermal oxidation process. Furthermore, resist films 41A and 41B shown in FIG. 10 are formed in a photolithography process, and p type impurity ions for control of threshold voltage are implanted into the SOI layer 30 at a low concentration through the gate oxide layer 40, followed by removing the resist films 41A and 41B. In the case of fabrication of a PMOSFET, n type impurity ions are implanted in place of the p type impurity ions.

Figure 11:
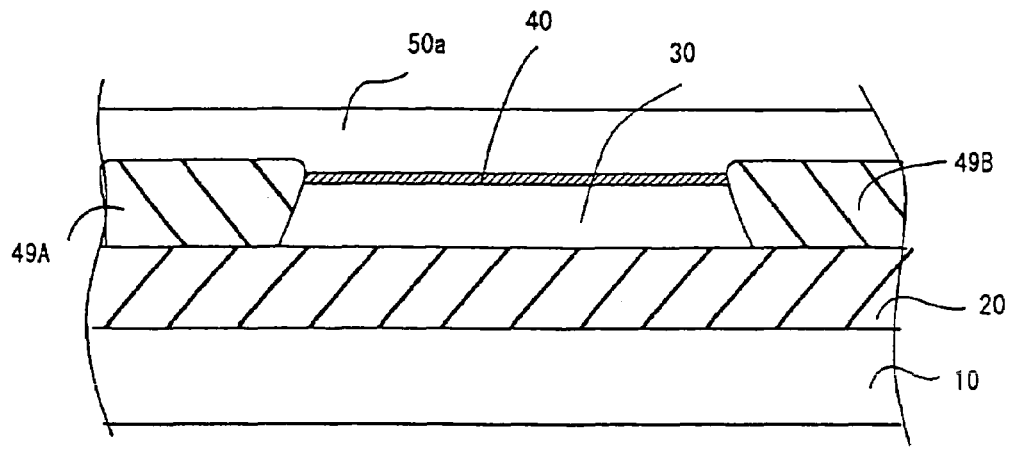
FIG. 11 is a schematic sectional view in a step of forming a polysilicon film.
Figure 12:
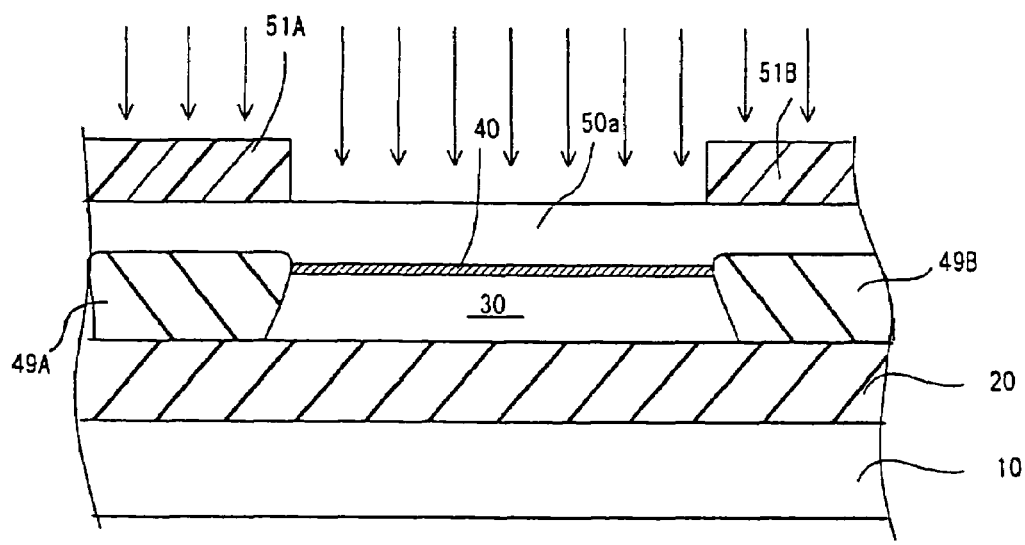
FIG. 12 is a schematic sectional view in a step of implanting ions in the polysilicon film.
Figure 13:
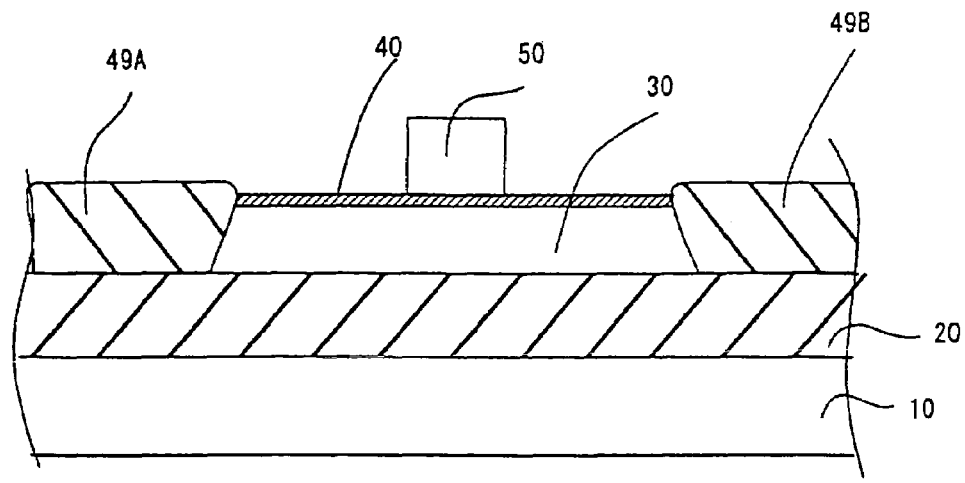
FIG. 13 is a schematic sectional view in a step of forming a gate region.

Subsequently, as shown in FIG. 11, in a low-pressure CVD (Chemical Vapor Deposition) method, a polysilicon film 50a is deposited on an entire surface of the gate oxide layer 40. Furthermore, as shown in FIG. 12, resist films 51A and 51B are formed in the photolithography process such that a device formation region may be opened, and then impurity ions are introduced into the polysilicon film 50a. In photolithography and etching processes, as shown in FIG. 13, a polysilicon film 50 that constitutes a gate electrode is patterned so as to have a gate length of approximately 0.15 μm.

Figure 14:
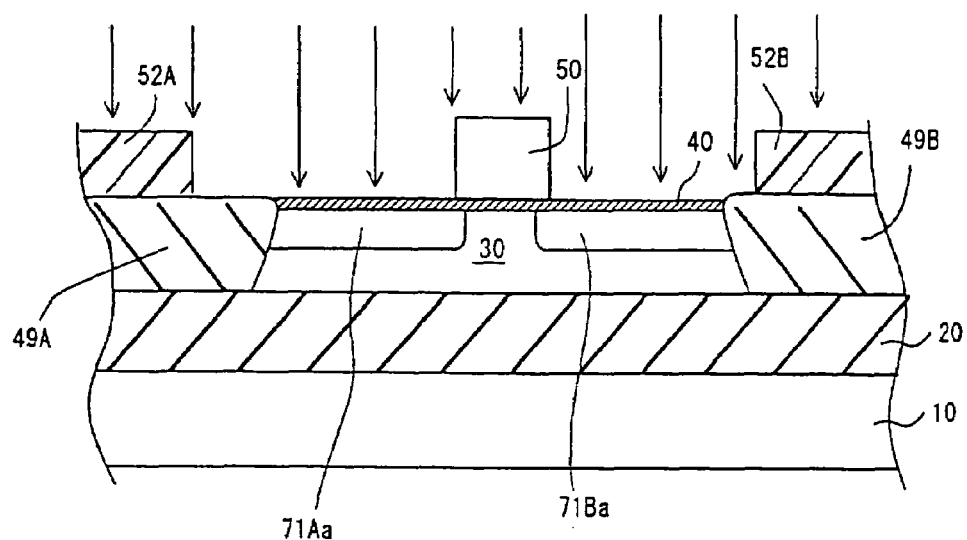
FIG. 14 is a schematic sectional view in a step of forming an ion implantation region for an extension region.
Figure 15:
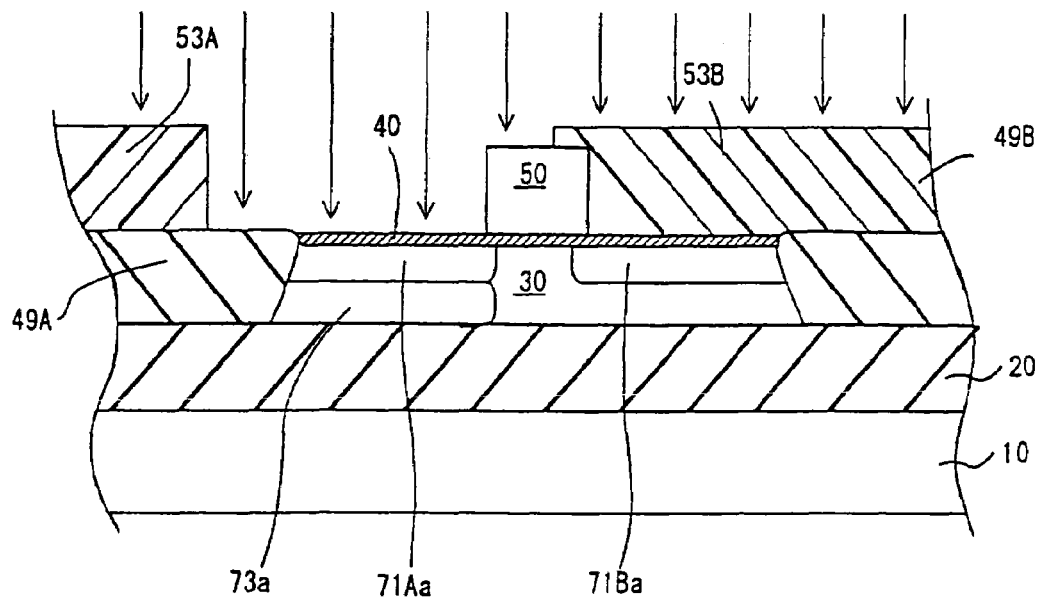
FIG. 15 is a schematic sectional view in a step of forming an ion implantation region for an extracting region.

Subsequently, as shown in FIG. 14, in a photolithography process, resist films 52A and 52B are formed, and then n type impurity ions such as phosphorus are implanted into the SOI layer 30 using the polysilicon film 50 and the element isolation films 49A and 49B as masks, at a relatively low concentration, for example, at the dose of approximately $1\times10^{13}$ to $1\times10^{15}/cm^2$ resulting in the concentration of approximately $1\times10^{18}$ to $1\times10^{20}/cm^3$. As a result, ion implantation regions 71Aa and 71Ba for extension regions are formed self-aligned to the polysilicon film 50. Thereafter, the resist films 52A and 52B are etched and removed. Furthermore, as shown in FIG. 15, in a photolithography process, resist films 53A and 53B are formed such that one ion implantation region 71Aa alone is exposed. With an ion implantation depth and a concentration distribution controlled, p type impurity ions such as boron (B) or boron fluoride ($BF_2$) are implanted into the silicon layer 30 at a relatively high concentration, for example, at the dose of approximately $3\times10^{14}$ to $1\times10^{15}/cm^2$ resulting in the concentration of approximately $1\times10^{19}$ to $1\times10^{20}/cm^3$. As a result, an ion implantation region 73a for an extracting region described later is formed below the ion implantation region 71Aa. In the above explanation of the present embodiment, with the ion implantation depth and the concentration distribution controlled, the ion implantation process for the extension regions (LDD region) and the ion implantation process for the extracting region are consecutively performed. The present invention is however not restricted on such process order.

Figure 16:
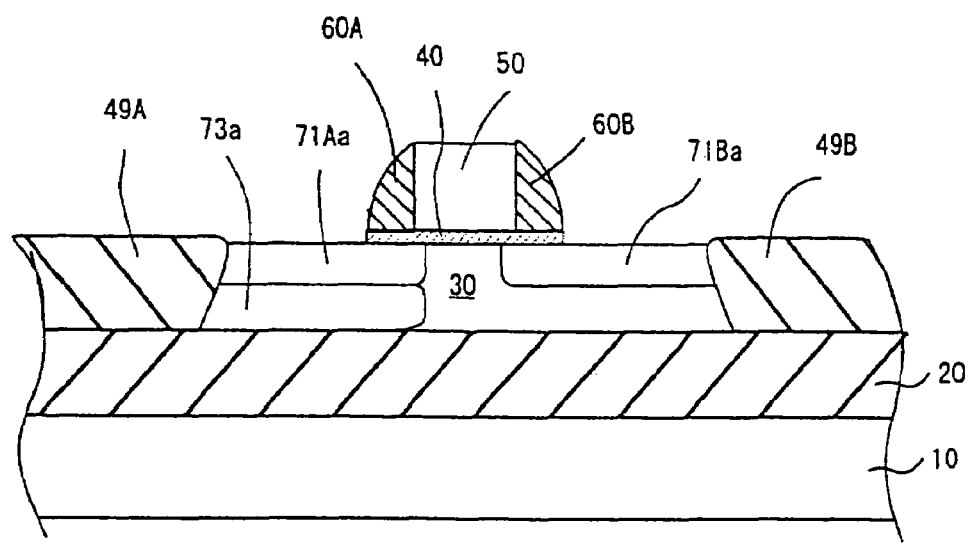
FIG. 16 is a schematic sectional view in a step of forming a gate electrode.

Subsequently, The resist films 53A and 53B are removed by etching, and then a silicon nitride film or non-doped silicon oxide (NSG) is deposited on an entire surface in the CVD method. Thereafter, the silicon nitride film or the NSG is etched back by performing anisotropic dry etching with high etching rate in the depth direction of the SOI layer 30. As a result, as shown in FIG. 16, sidewall spacers 60A and 60B are formed on both sides of the polysilicon film 50, and a gate electrode including the gate oxide layer 40, polysilicon film 50 and sidewall spacers 60A and 60B is formed.

Figure 17:
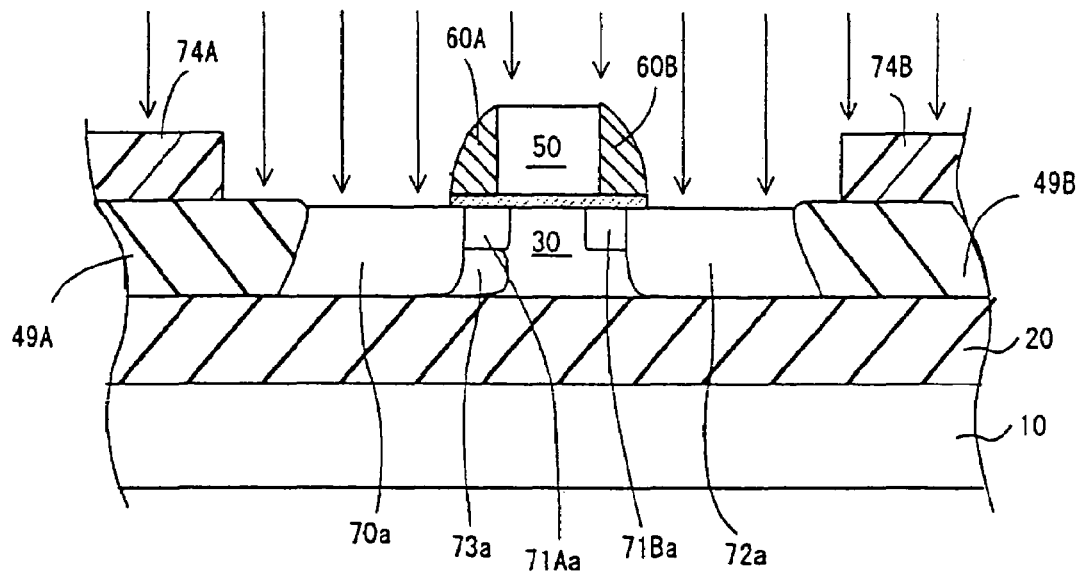
FIG. 17 is a schematic sectional view in a step of implanting impurity ions in source and drain regions.

Thereafter, as shown in FIG. 17, resist films 74A and 74B are formed in a photolithography process, and then n type impurity ions are implanted into the exposed surface of the SOI layer 30 in the both sides of the gate electrode using the gate electrode and the element isolation films 49A and 49B as masks, at a relatively high concentration, for example, at the dose of approximately $1\times10^{15}/cm^2$ resulting in the concentration of approximately $2\times10^{20}/cm^3$. As a result, ion implantation regions 70a and 72a for source and drain regions are formed self-aligned to the gate electrode. These ion implantation regions 70a and 72a reach up to a top surface of the buried oxide film 20 in a depth direction of the SOI layer 30. Thereafter, the resist films 74A and 74B are removed by etching.

Figure 18:
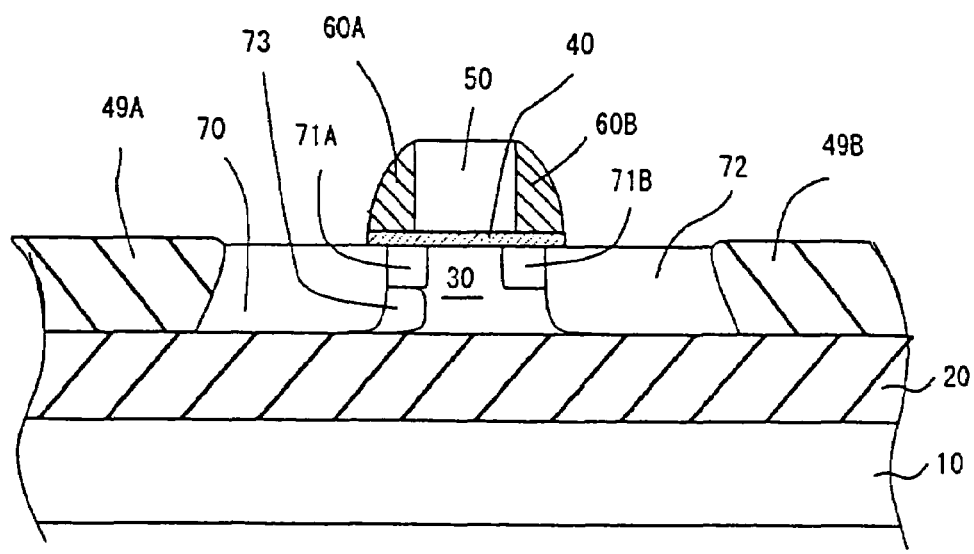
FIG. 18 is a schematic sectional view in a step of performing impurity activation by heat treatment.

Furthermore, by performing heat treatment such as RTA (Rapid Thermal Annealing) or the like, impurities introduced in the ion implantation regions 70a, 72a, 71Aa, 71Ba, and 73a are activated. As a result, as shown in FIG. 18, in the SOI layer 30 and in both sides of the gate electrode, a source region 70 and a drain region 72 ($n^+$ diffusion layer) of high concentration are formed, and extension regions 71A and 71B ($n^-$ diffusion layer) of low concentration, which are in contact with the source and drain regions 70 and 72 respectively and extend to the region below the gate electrode, are formed in a relatively shallow region. In addition, a extracting region 73 (a $p^+$ diffusion layer having a layer thickness of approximately 0.025 μm) of high concentration is formed below one extension region 71A and in contact with the source region 70. Here, a region surrounded by the extension regions 71A and 71B and the extracting region 73 in the SOI layer 30 forms so-called body region ($p^-$ diffusion layer). In the explanation below, the SOI layer 30 will be referred to as the body region 30. In the embodiment, the ion implantations for the source and drain regions 70 and 72, extension regions 71A and 71B and the extracting region 73 are sequentially performed. Thereafter heat treatment is performed and the implanted impurities are thereby activated. Each of the ion implantations for the source/drain region, the extension regions and the extracting region may be followed by heat treatment.

Figure 19:
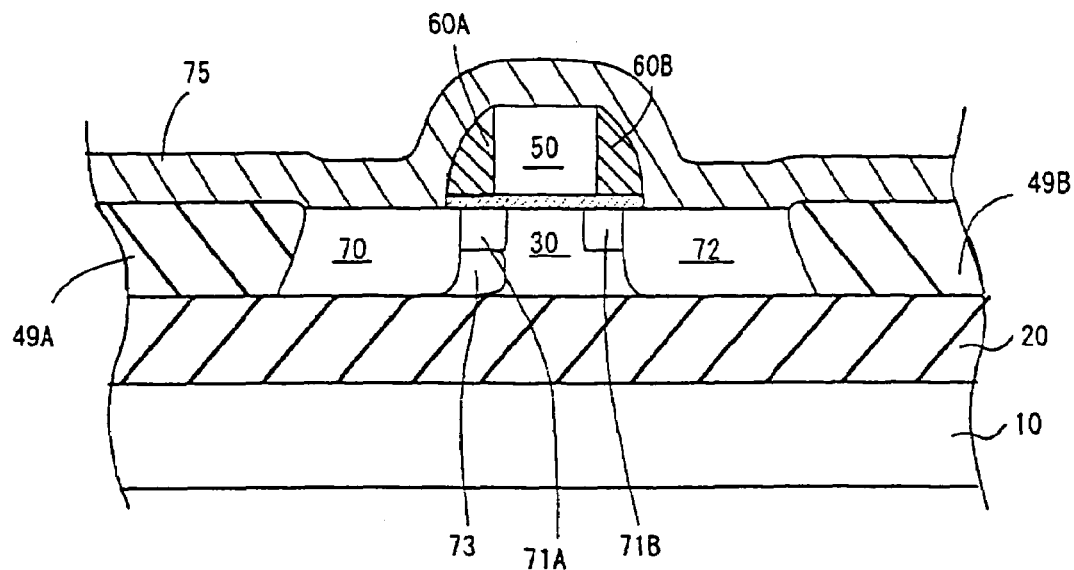
FIG. 19 is a schematic sectional view in a step of forming a refractory metal film.
Figure 20:
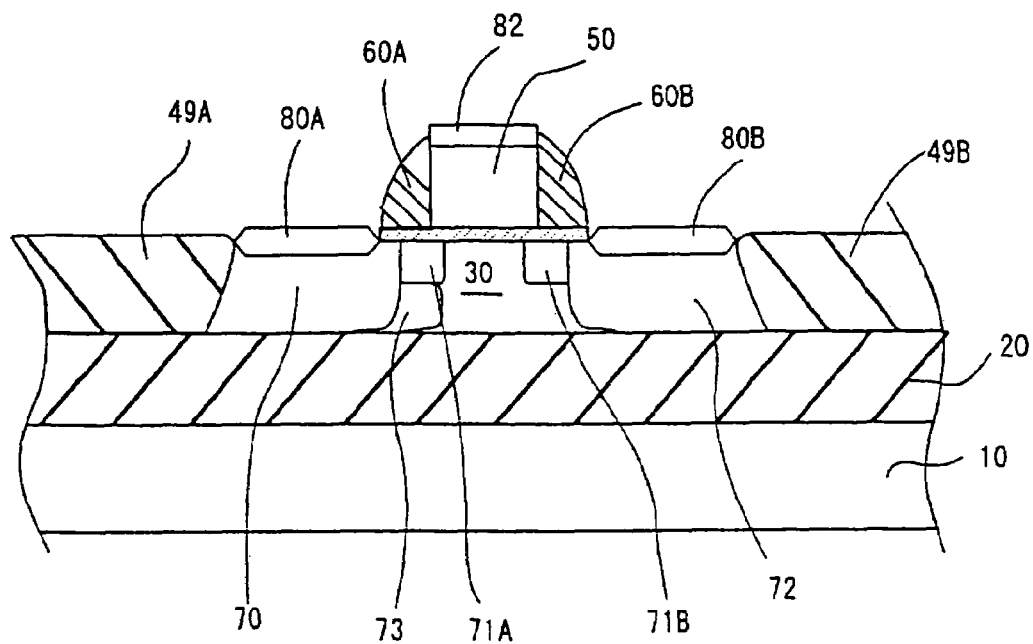
FIG. 20 is a schematic sectional view in a step of forming a silicide film.

Subsequently, a refractory metal such as cobalt, titanium or nickel is deposited on an entire surface in the sputtering process, and as shown in FIG. 19, a refractory metal film 75 is thereby formed. By performing the heat treatment, only silicon, which is in contact with the refractory metal film 75, selectively reacts with the refractory metal and forms so-called silicide. Thereafter, un-reacted refractory metal is removed by wet etching, and as shown in FIG. 20, silicide films 80A, 80B and 82 are thereby formed self-aligned in the neighborhood of a top surface of the source and drain regions 70 and 72 and in the neighborhood of a top surface of the polysilicon film 50 respectively. When heat treatment is further performed, a crystal structure of the silicide films 80A, 80B and 82 can be stabilized and lower resistance can be realized.

Thereafter, an interlayer insulating film made of non-doped silicon oxide is deposited on an entire surface. In photolithography and anisotropic etching processes, contact holes 85A and 85B (FIG. 1) that reach the silicide films 80A and 80B are formed in the interlayer insulating film. In the next place, wiring materials (contact metal) 86A, 86B are buried in the contact holes 85A and 85B, and a lower interconnecting layer is thereby formed. Furthermore, a single or a plurality of upper wiring layers may be disposed above the lower interconnecting layer.

As explained above, in the first embodiment, the semiconductor device is provided with the extracting region 73 not below the source and drain regions but below the channel formation portion in the neighborhood of the source region 73. The extracting region 73 is not in direct contact with the source contact 86A or the silicide film 80A but in contact with the source region 70. In the case of an NMOS, a $p^+$ region and an $n^+$ region join, which are high concentration regions of different conductivity types from each other, are in junction with each other. Accordingly, a structure in which a tunnel current can easily get over a potential barrier and flow out can be obtained. Such the extracting region 73 is formed in a depth direction of the silicon layer. Accordingly, there is no increase in an element area that causes the lowering of the degree of integration. Furthermore, since such the extracting region 73 is not formed below the source region 70, the device structure of the embodiment can be obtained not only in a PD type SOI but also in an FD type SOI that has a thin silicon layer.

<Second Embodiment>

Figure 21:
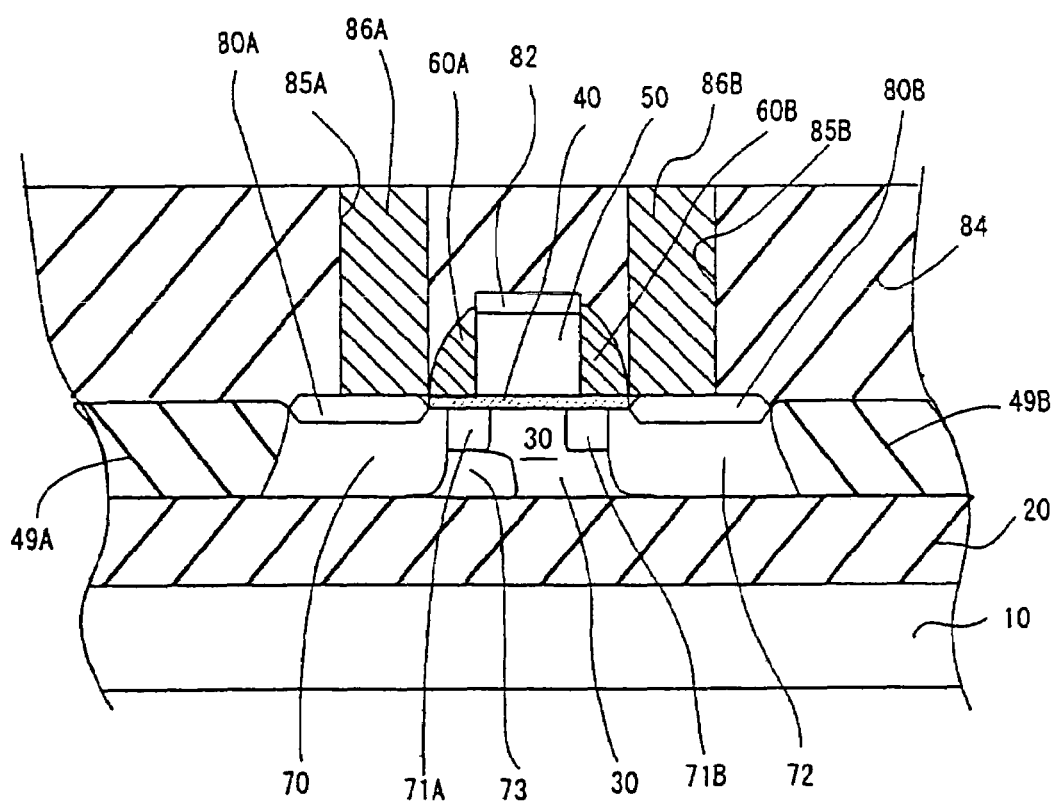
FIG. 21 is a schematic sectional view of a semiconductor device in a second embodiment.

FIG. 21 shows a sectional view of a semiconductor device in a second embodiment according to the present invention. In the drawing, a structure of one MOSFET that is included in semiconductor device 2 is shown. The semiconductor device 2 is not restricted to being constituted of one MOSFET, but may be constituted of a plurality of MOSFETs.

The semiconductor device 2 is the same as the semiconductor device 1 (FIG. 1) in the first embodiment except for a position and a dimension of the extracting region 73. The extracting region 73 is disposed so as to extend from a lower portion of the source region 70 toward the SOI layer 30. The extracting region 73 in the present embodiment is disposed so as to extend from a vertical boundary line between the sidewall spacer 60A and the polysilicon layer 50 to a region directly below the gate oxide layer 40. Therefore, the extracting region 73 extends close to the neighborhood of a electrically conducting channel to be formed in the body region 30.

FIGS. 22 through 26 show the respective sectional views of the semiconductor device in the respective steps of a fabricating method of the semiconductor device in the second embodiment.

Figure 22:
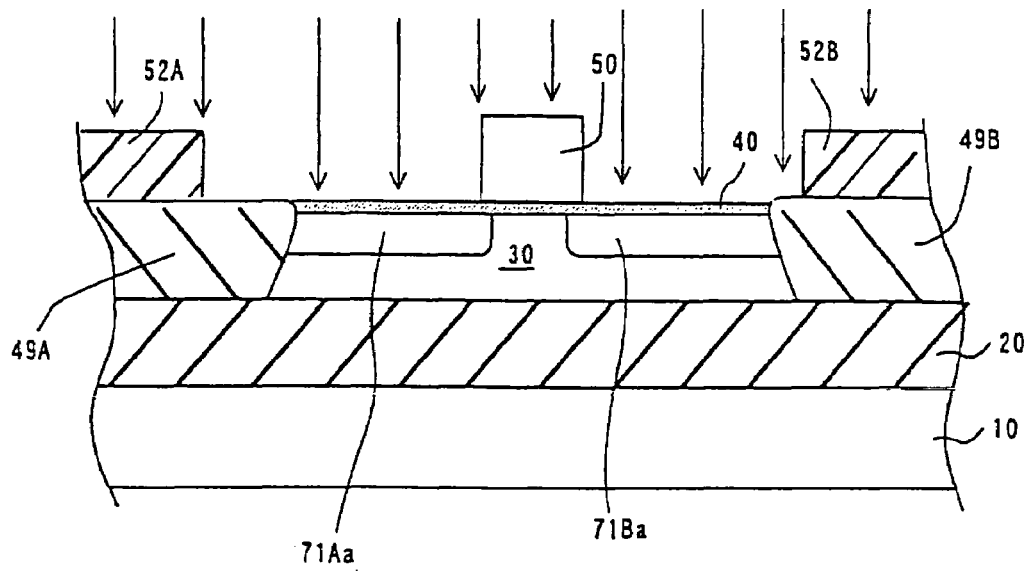
FIG. 22 is a schematic sectional view in a step of forming an ion implantation region for an extension region.

First, steps the same as those of FIGS. 2 through 14 in the first embodiment are performed. As a result, as shown in FIG. 22, ion implantation regions 71Aa and 71Ba for extension regions are formed self-aligned in the neighborhood of a top surface of the SOI layer 30 in both sides of the polysilicon layer 50.

Figure 23:
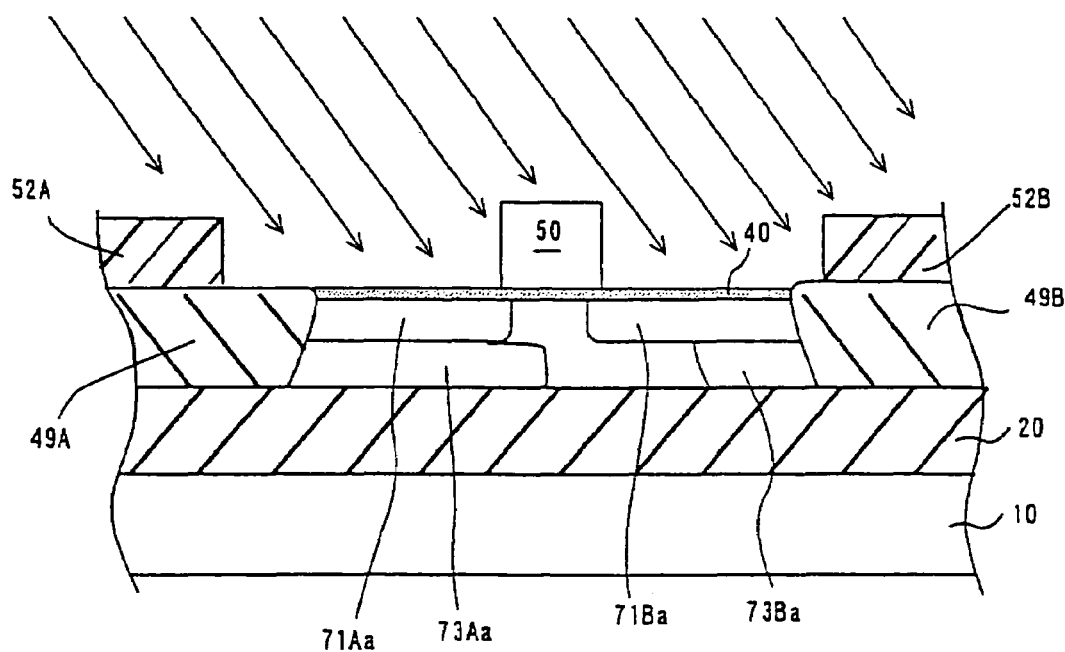
FIG. 23 is a schematic sectional view in a step of forming an ion implantation region for an extracting region.

Subsequently, By performing an oblique ion implantation with an ion implantation depth and a concentration distribution controlled, p type impurity ions are obliquely implanted using the polysilicon film 50 and element isolation films 49A and 49B as masks at a relatively high concentration, for example, at the dose of approximately $3\times10^{14}$ to $1\times10^{15}/cm^2$ resulting in the concentration of approximately $1\times10^{19}$ to $1\times10^{20}/cm^3$. Therefore, an ion implantation region 73Aa for the extracting region, which extends toward the region below the polysilicon film 50, is formed below the ion implantation region 71Aa. At the same time, an ion implantation region 73Ba is formed below the other ion implantation region 71Ba and laterally apart from the polysilicon film 50 (FIG. 23).

Figure 24:
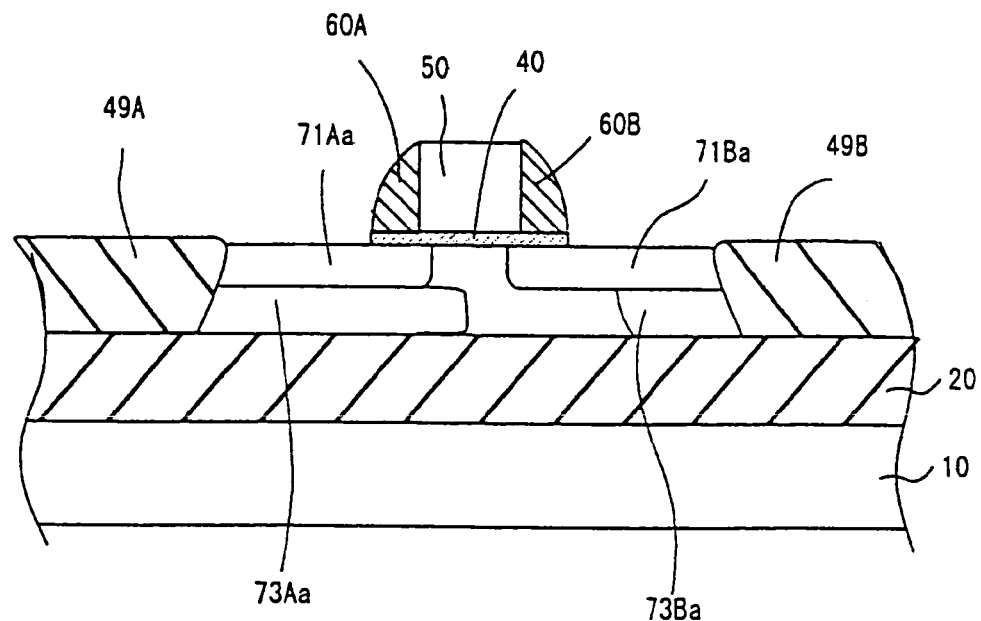
FIG. 24 is a schematic sectional view in a step of forming a gate electrode.

In the next place, after the resist films 52A and 52B are removed by etching, a silicon nitride film or non-doped silicon oxide is deposited on an entire surface in the CVD method. Thereafter, the silicon nitride film or the non-doped silicon oxide is etched back by performing anisotropic dry etching with high etching rate in a depth direction of the SOI layer 30. As a result, as shown in FIG. 24, sidewall spacers 60A and 60B are formed on both sides of the polysilicon film 50, and a gate electrode including the gate oxide layer 40, the polysilicon film 50 and the sidewall spacers 60A and 60B is formed.

Figure 25:
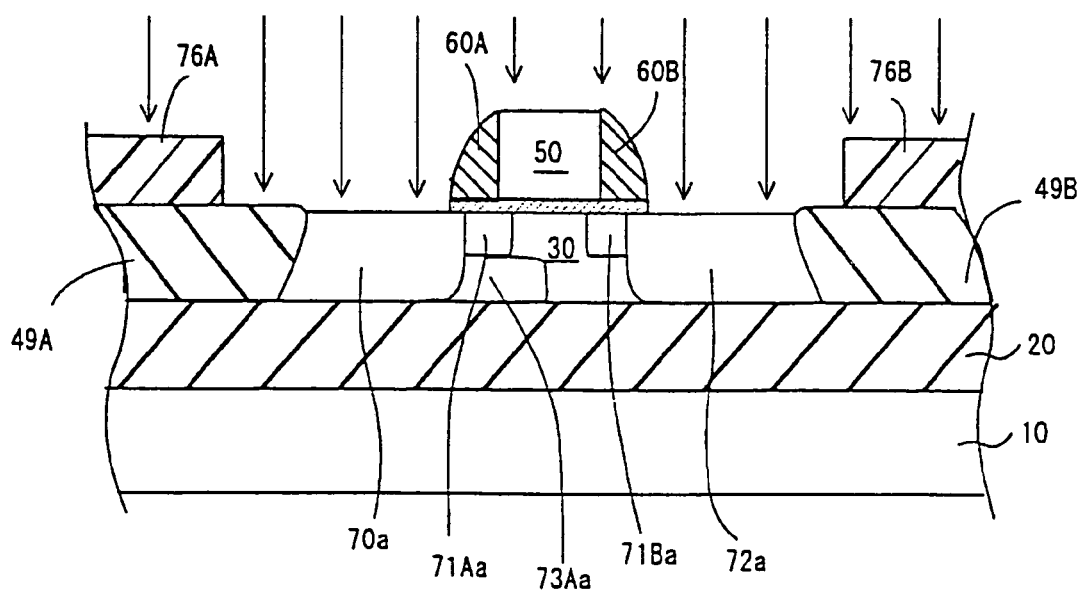
FIG. 25 is a schematic sectional view in a step of implanting impurity ions in source and drain regions.

Thereafter, as shown in FIG. 25, resist films 76A and 76B are formed in a photolithography process. Thereafter, by performing an ion implantation using the gate electrode and the element isolation films 49A and 49B as masks, n type impurity ions is implanted into an exposed surface of the SOI layer 30 in both sides of the gate electrode at a relatively high concentration, for example, at the dose of approximately $1\times10^{15}/cm^2$ resulting in the concentration of approximately $2\times10^{20}/cm^3$. As a result, ion implantation regions 70a and 72a for source and drain regions are formed self-aligned. These ion implantation regions 70a and 72a reach up to a top surface of the buried oxide film 20 in a depth direction of the SOI layer 30. Thereafter, the resist films 76A and 76B are removed by etching.

Figure 26:
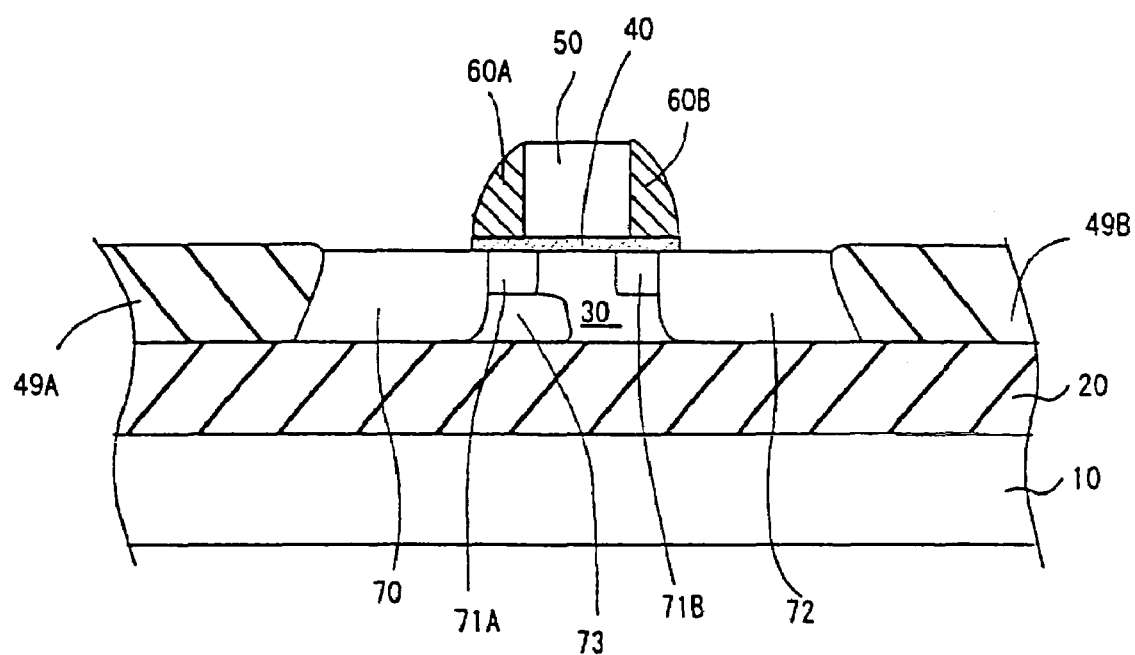
FIG. 26 is a schematic sectional view in a step of performing impurity activation by heat treatment.

Furthermore, by performing heat treatment such as the RTA or the like, impurities introduced in the ion implantation regions 70a, 72a, 71Aa, 71Ba, and 73Aa are activated. As a result, as shown in FIG. 26, the source region 70 and drain region 72 ($n^+$ diffusion layer) of high concentration are formed in the SOI layer 30 in both sides of the gate electrode, and extension regions 71A and 71B ($n^-$ diffusion layer) of low concentration, which are in contact with the source and drain regions 70 and 72 and extend to the region below the gate electrode, are formed in a relatively shallow region. Furthermore, an extracting region 73 (a $p^+$ diffusion layer having a layer thickness of substantially 0.025 µm) of high concentration, which is in contact with the source region 70, is formed in a relatively deep region below one extension region 71A. Subsequently, similarly to the fabricating method in the first embodiment, a lower interconnecting layer is formed, and the semiconductor device 2 in the present embodiment shown in FIG. 21 is thereby fabricated.

As mentioned above, the semiconductor device 2 in the second embodiment can provide advantages similar to that in the semiconductor device 1 in the first embodiment. Furthermore, since the oblique ion implantation is used in the step of ion implantation for the extracting region (FIG. 23), the resist films 52A and 52B, which is used in the step of the ion implantation for the extension region (FIG. 22), can be diverted to the step of the oblique ion implantation. Therefore, there is an advantage in that the step of forming a photosensitive mask covering the drain region is unnecessary. Furthermore, since the oblique ion implantation is performed to form the extracting region, the extracting region 73 on the source side can be formed so as to extend more toward the body region 30, that is, the extracting region 73 can be formed toward the neighborhood of the electrically conducting channel in the body region 30. Accordingly, the extracting effect can be more expected.

<Third Embodiment>

Figure 27:
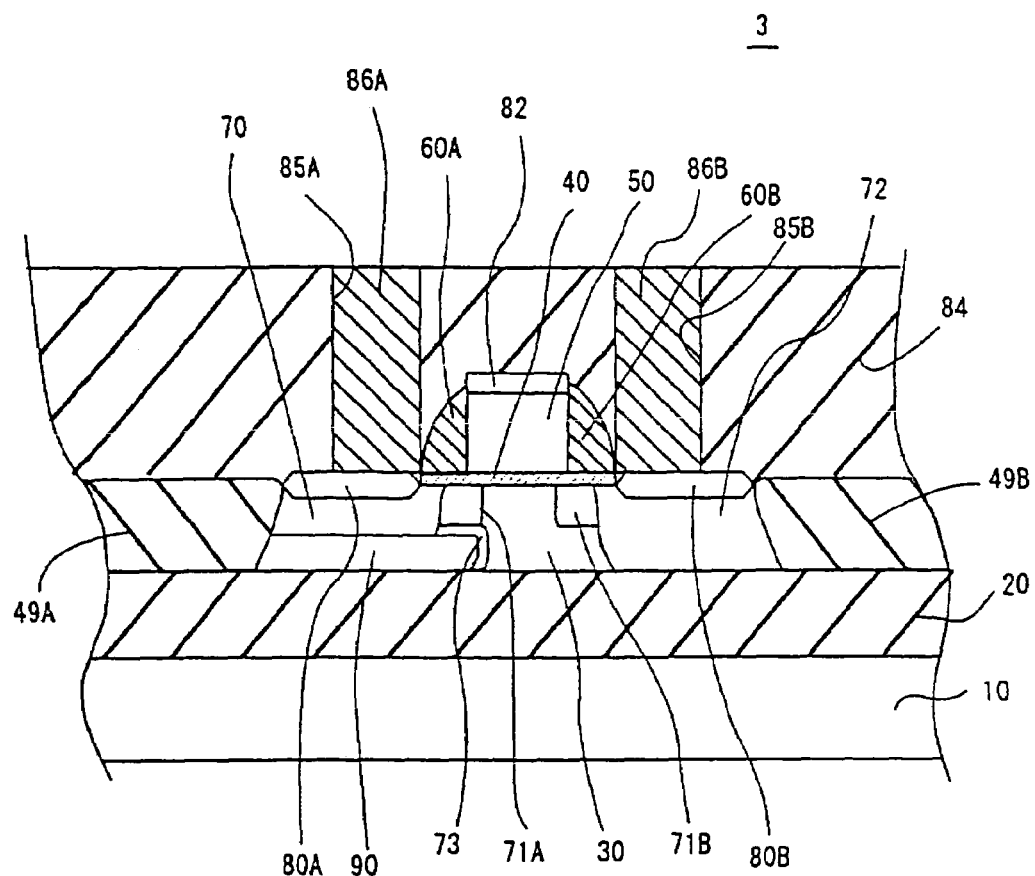
FIG. 27 is a schematic sectional view of a semiconductor device in a third embodiment.

FIG. 27 shows a sectional view of a semiconductor device in a third embodiment according to the present invention. In the drawing, the structure of one MOSFET that is included in semiconductor device 3 is shown. The semiconductor device 3 is not restricted to being constituted of one MOSFET, but may be constituted of a plurality of MOSFETs.

The semiconductor device 3 is similar to the semiconductor device 1 (FIG. 1) in the first embodiment in that it is provided with the extracting region 73. The semiconductor device 3 is different from the semiconductor device 1 in that defect layer 90 is further provided. The defect layer 90 is disposed in the neighborhood of the extracting region 73 and laterally adjacent to the extracting region 73 and the source region 70. The defect layer 90 can be formed by generating lattice defects by ion-implanting a heavy element such as Si or As. In the defect layer 90, defect levels are formed, and therefore probability of recombination of electrons and holes can be heightened.

Figure 28:
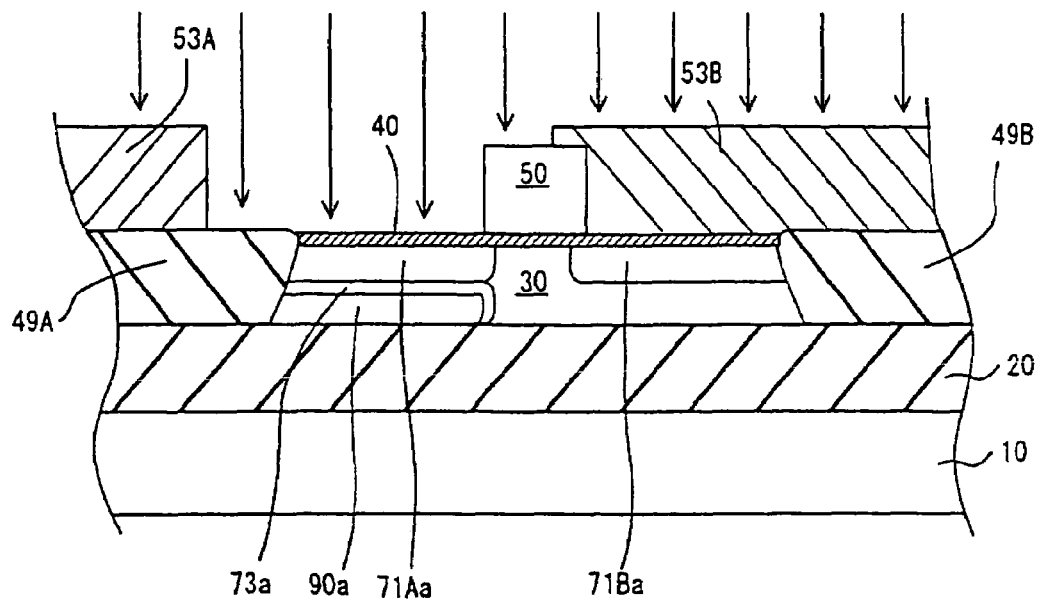
FIG. 28 is a schematic sectional view in a step of forming an ion implantation region for a defect layer.
Figure 29:
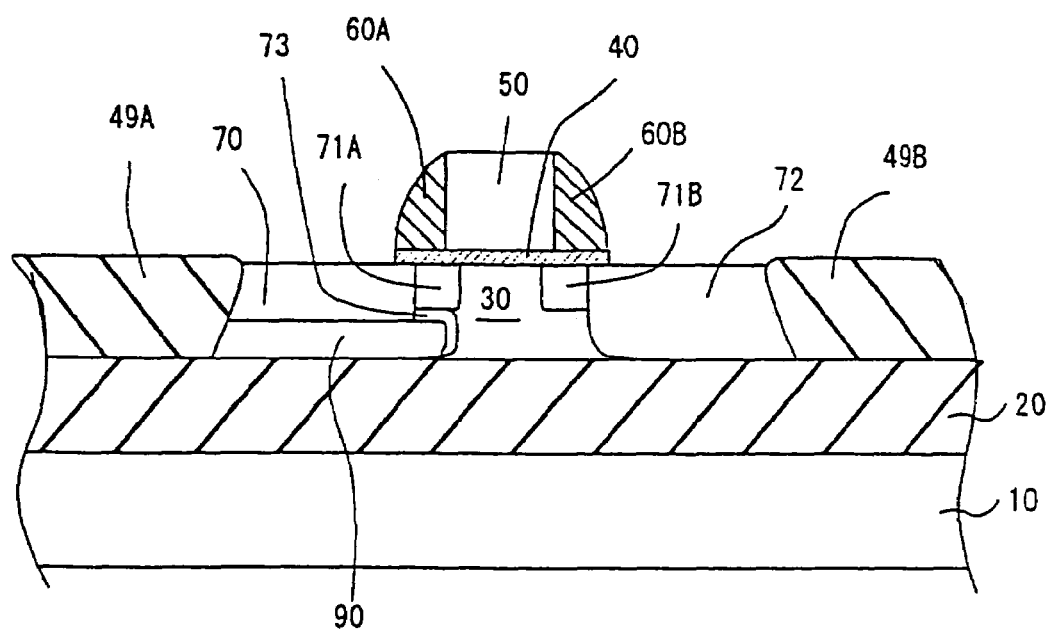
FIG. 29 is a schematic sectional view in a step of forming the extracting region and the defect layer.

FIGS. 28 and 29 show schematic sectional views in the respective fabricating steps of the semiconductor device 3 in the third embodiment.

First, steps similar to that shown in FIGS. 2 through 14 in the first embodiment are performed. Subsequently, with an ion implantation depth and concentration distribution controlled, heavy metal ions such as silicon or arsenic are implanted. Thereby, as shown in FIG. 28, an ion implantation region 90a for the defect layer is formed below the ion implantation region 71Aa.

Subsequently, a step similar to that shown in FIG. 17 in the first embodiment is performed, and an ion implantation region for the source/drain region is thereby formed. The implanted impurities are activated by performing heat treatment such as the RTA. As a result, as shown in FIG. 29, source region 70 and drain region 72 ($n^+$ diffusion layer) of high concentration are formed in the SOI layer 30 in both sides of the gate electrode. At the same time, extension regions 71A and 71B ($n^-$ diffusion layer) of low concentration, which are in contact with the source and drain regions 70 and 72 and extend toward the region below the gate electrode, are formed in a relatively shallow region. A extracting region 73 (a $p^+$ diffusion layer having a layer thickness of approximately 0.025 µm) of high concentration, which is in contact with the source region 70, are formed in a relatively deep region below one extension region 71A. Furthermore, a defect layer 90 having the thickness of approximately 0.02 µm is formed in contact with both of the extracting region 73 and the source region 70. Subsequently, similarly to the fabricating method involving the first embodiment, a lower interconnecting layer is formed. Consequently, the semiconductor device 3 involving the present embodiment shown in FIG. 27 is fabricated.

The ion implantation region for the extracting region may be formed by using the above-mentioned method in the second embodiment instead of the method in the present embodiment.

As mentioned above, in the third embodiment, the semiconductor device 3 according to the invention can provide advantages similar to that of the semiconductor device 1 according to the first embodiment. Furthermore, since the defect layer 90 remains in the neighborhood of the source region 70 and the extracting region 73, remaining carriers in the body region 30 can be extracted more effectively than in the first and second embodiments. The holes are extracted through the defect levels in the defect layer 90. Since the high concentration regions (the source region and the extracting region) of different conductivity types are in junction with each other, the extraction of the holes can be more effectively performed at the junction. Accordingly, further suppression of the substrate floating effect can be expected.

The Embodiment 1 through 3 are explained mainly of the semiconductor devices including an NMOSFET. However, the present invention can be applied not only to semiconductor devices including an NMOSFET but also to semiconductor devices including a PMOSFET.

The present invention has been explained with reference to preferable embodiments. It should be understood that one skilled in the art might think of various modifications and alterations. Such modifications and alterations all are included in the scope of attached claims.

This application is based on a Japanese patent application No. 2003-106793 which is hereby incorporated by reference.

What is claimed is:

1. A semiconductor device having a Silicon-On-Insulator structure which includes a semiconductor layer formed on an insulator, and having at least one Metal-Oxide-Semiconductor-Field-Effect-Transistor (MOSFET) element, the MOSFET element comprising:
    a source region;
    a drain region which is opposed to said source region;
    a body region disposed between said source region and said drain region;
    a gate region positioned on or close to a surface of said body region, so as to form an electrically conducting channel in said body region;
    an extracting region being in contact with both of said body region and said source region, said extracting region having a conductivity type which is the same as a conductivity type of said body region, and having an impurity concentration higher than that of said body region; and
    a defect layer in which lattice defects are formed, said defect layer being formed in a neighborhood of said extracting region.

2. A semiconductor device according to claim 1, wherein said defect layer is in contact with both of said source region and said extracting region.

3. A semiconductor device according to claim 1, wherein said defect layer is a region of silicon ion implantation.

4. A semiconductor device according to claim 1, wherein said defect layer is a region of arsenic ion implantation.

5. A semiconductor device according to claim 1, further comprising an extension region in contact with said source region and formed above said extracting region, wherein the impurity concentration in said extracting region is higher than an impurity concentration in said extension region.

6. A semiconductor device according to claim 5, wherein the impurity concentration of said extraction region is in the range from about $1 \times 10^{19}$ cm$^{+3}$ to about $1 \times 10^{20}$ cm$^{-3}$.

7. A semiconductor device comprising:
    a semiconductor layer on an insulator;
    a source region in said semiconductor layer;
    a drain region in said semiconductor layer, said drain region being opposed to said source region;
    a body region of said semiconductor layer between said source region and said drain region;
    a gate positioned on or close to a surface of said body region;
    an extracting region in said semiconductor layer, in contact with said body region and said source region, said extracting region having a conductivity type which is the same as a conductivity type of said body region, and having an impurity concentration higher than an impurity concentration of said body region,
    wherein said extracting region extends from said source region to directly under the gate; and
    a defect layer disposed near said extracting region, said defect layer having lattice defects therein.

8. A semiconductor device according to claim 7, wherein said defect layer is a region of silicon or arsenic ion implantation.

9. A semiconductor device according to claim 7, wherein said defect layer is in contact with both of said source region and said extracting region.

10. A semiconductor device according to claim 7, further comprising an extension region in contact with said source region and formed above said extracting region, wherein the impurity concentration in said extracting region is higher than an impurity concentration in said extension region.

11. A semiconductor device according to claim 10, wherein the impurity concentration of said extraction region is in the range from about $1 \times 10^{19}$ cm$^{-3}$ to about $1 \times 10^{20}$ cm$^{-3}$.

* * * * *